United States Patent
Sato et al.

(10) Patent No.: US 8,482,439 B2
(45) Date of Patent: Jul. 9, 2013

(54) ADAPTIVE DIFFERENTIAL PULSE CODE MODULATION ENCODING APPARATUS AND DECODING APPARATUS

(75) Inventors: Yasushi Sato, Kitakyushu (JP); Atsuko Ryu, Kitakyushu (JP)

(73) Assignee: Kyushu Institute of Technology, Kitakyushu-Shi, Fukuoka (JP)

( * ) Notice: Subject to any disclaimer, the term of this patent is extended or adjusted under 35 U.S.C. 154(b) by 104 days.

(21) Appl. No.: 13/142,010

(22) PCT Filed: Dec. 25, 2009

(86) PCT No.: PCT/JP2009/071542
§ 371 (c)(1),
(2), (4) Date: Jun. 24, 2011

(87) PCT Pub. No.: WO2010/074200
PCT Pub. Date: Jul. 1, 2010

(65) Prior Publication Data
US 2011/0260893 A1    Oct. 27, 2011

(30) Foreign Application Priority Data

Dec. 26, 2008   (JP) ................................. 2008-333060

(51) Int. Cl.
*H03M 7/32* (2006.01)
(52) U.S. Cl.
USPC ............................................. 341/77; 341/76
(58) Field of Classification Search
USPC . 341/77, 143, 51, 76; 375/245, 22; 348/419.1
See application file for complete search history.

(56) References Cited

U.S. PATENT DOCUMENTS

| 4,518,950 A | 5/1985 | Petr |
| 4,788,692 A * | 11/1988 | Takebayashi et al. ........ 375/245 |

(Continued)

FOREIGN PATENT DOCUMENTS

| JP | 62-30434 A | 2/1987 |
| JP | 63-18727 A | 1/1988 |

(Continued)

OTHER PUBLICATIONS

*ADPCM Voice Coding Technology*, Found at: http://www.oki.com/jp/rd/ss/adpcm.html, Accessed May 11, 2011, Published by Oki Electric Industry Co., Ltd., and English language translation of the webpage.

(Continued)

*Primary Examiner* — Brian Young
(74) *Attorney, Agent, or Firm* — Buchanan Ingersoll & Rooney P.C.

(57) ABSTRACT

A signal corresponding to a short-period change and a signal corresponding to a long-period change of a sound signal are detected, and optimal quantization is performed based on the combination of the two signals. In an ADPCM encoding apparatus (100), a differential value $d_n$ between a 16-bit input signal $X_n$ and a decoded signal $Y_{n-1}$ of one sample ago is calculated by a subtractor (102). Thereafter, the 16-bit differential value $d_n$ is adaptively quantized by an adaptive quantizing section (103), so as to be converted to a (1 to 8)-bit length-variable ADPCM value $D_n$. Thereafter, the ADPCM value $D_n$ is compression-encoded by a compression-encoding section (108) to generate a signal $D'_n$, and the signal $D'_n$ is framed by a framing section (130) and outputted. Further, in an ADPCM decoding apparatus, a framed input signal is subjected to a reverse of the aforesaid process so as to be decoded.

7 Claims, 8 Drawing Sheets

U.S. PATENT DOCUMENTS

| | | | |
|---|---|---|---|
| 5,334,977 A * | 8/1994 | Kato | 341/76 |
| 5,524,024 A * | 6/1996 | Lin | 375/244 |
| 6,055,275 A * | 4/2000 | Pinier et al. | 375/244 |
| 6,212,495 B1 | 4/2001 | Chihara | |
| 6,366,881 B1 | 4/2002 | Inoue | |

FOREIGN PATENT DOCUMENTS

| | | | |
|---|---|---|---|
| JP | 63-187738 A | 8/1988 | |
| JP | 8-321782 A | 12/1996 | |
| JP | 10-233696 A | 9/1998 | |
| JP | 11-355147 A | 12/1999 | |
| JP | 2008-046405 A | 2/2008 | |

OTHER PUBLICATIONS

Uyematsu, *The Most Essential Data Compression Method Shannon-Fano Coding and Huffman Coding*, Introduction to Text Data Compression 39-53 (Oct. 15, 1994), and English language translation of selection.

Extended European Search Report dated Jun. 27, 2012, issued by the European Patent Office in corresponding European Application No. 09834996.2. (5 pages).

* cited by examiner

SA → CLOSE TO 0
AV → CLOSE TO 0 } WAVEFORM WHOSE AMPLITUDE VALUE IS CLOSE TO 0

SA → LARGE
AV → CLOSE TO 0 } RANDOM WAVEFORM

SA → CLOSE TO 0
AV → LARGE } WAVEFORM WHOSE AMPLITUDE VARIES SLOWLY

SA → LARGE
AV → LARGE } A WAVEFORM WHOSE AMPLITUDE VARIES RANDOMLY IS SUPERIMPOSED ON A WAVEFORM WHOSE AMPLITUDE VARIES SLOWLY

| | Z | | | | | | | |
|---|---|---|---|---|---|---|---|---|
| 7 | 4 | 8 | 12 | 16 | 20 | 24 | 28 | 32 |
| 6 | 8 | 12 | 16 | 20 | 24 | 28 | 32 | 36 |
| 5 | 12 | 16 | 20 | 24 | 28 | 32 | 36 | 40 |
| 4 | 16 | 20 | 24 | 28 | 32 | 36 | 40 | 44 |
| 3 | 20 | 24 | 28 | 32 | 36 | 40 | 44 | 48 |
| 2 | 24 | 28 | 32 | 36 | 40 | 44 | 48 | 52 |
| 1 | 28 | 32 | 36 | 40 | 44 | 48 | 52 | 56 |
| 0 | 32 | 36 | 40 | 44 | 48 | 52 | 56 | 60 |
| S\A | 0 | 1 | 2 | 3 | 4 | 5 | 6 | 7 |

ADAPTIVE DIFFERENTIAL PULSE CODE MODULATION ENCODING APPARATUS AND DECODING APPARATUS

TECHNICAL FIELD

The present invention relates to an adaptive differential pulse code modulation encoding apparatus and an adaptive differential pulse code modulation decoding apparatus, particularly to an encoding apparatus and a decoding apparatus capable of obtaining an excellent reproduced sound characteristic even when the data is sufficiently compressed by adaptive differential pulse code modulation.

BACKGROUND ART

ADPCM (Adaptive Differential Pulse-code Modulation) is a technique for encoding a differential value $d_n$ between a sampled value of one sample ago (index: n−1) and a current sampled value (index: n) with respect to a PCM (Pulse Code Modulation) signal of a sampled and digitally-coded sound signal, by using (adapting) a quantization width $\Delta_n$ corresponding to the differential value. With this technique, the PCM signal can be efficiently compressed.

An ADPCM encoding apparatus and an ADPCM decoding apparatus according to a prior art will be described below with reference to FIGS. 1A and 1B. In the ADPCM encoding apparatus shown in FIG. 1A, an inputted analog sound signal is sampled by an A/D converter 1, so that the signal is converted into a digital value $X_n$. Next, the digital value $X_n$ is encoded using an ADPCM method, and the encoded value $D_n$ is stored in a memory 8.

On the other hand, in the ADPCM decoding apparatus shown in FIG. 1B, the encoded signal $d_n$ is read out from the memory 8. Thereafter, the encoded signal $D_n$ is decoded (reproduced) using the ADPCM method, and the decoded value $Y_n$ is converted back into the analog sound signal by a D/A converter 13 (see Patent Document 1).

For example, a signed 16-bit PCM code can be converted to a signed 4-bit compressed ADPCM code using the aforesaid ADPCM method.

Next, the operation of the ADPCM encoding apparatus and the ADPCM decoding apparatus respectively shown in FIG. 1A and FIG. 1B will be described in detail.

In the ADPCM encoding apparatus shown in FIG. 1A, first, a differential value $d_n$ between a digital value $X_n$ of the sound signal at the current time and a decoded signal $Y_{n-1}$ of one sample ago obtained through a decoder 5, an adder 6 and a delay device 7 is obtained by an adder (subtractor) 2.

$$d_n = X_n - Y_{n-1}$$

Thereafter, an encoder 3 converts the differential value $d_n$ obtained by the adder 2 into a quantized value $D_n$ (an ADPCM value) by using an adaptive quantization rate $\Delta_n$ (an adaptive quantization characteristic) inputted from an adaptive quantizing section 4. In the quantization process at this time, the differential value $d_n$ is divided by the adaptive quantization rate $\Delta_n$, and the quotient obtained by performing the division calculation is converted into an integer, for example.

$$\Delta_n = \Delta_{n-1} \cdot M(D_{n-1})$$

$$D_n = [d_n/\Delta_n]$$

Incidentally, the M in the above equation of the adaptive quantization rate $\Delta_n$ is a function with an ADPCM value $D_{n-1}$ as a variable, and is determined based on the statistical nature of the signal waveform. One example of such configuration is shown in Non-patent Documents 1 and 2, for example. M<1 when the absolute value of the level of the quantized value is small, and M>1 when the absolute value of the level of the quantized value is large. Further, the $[d_n/\Delta_n]$ on the right side of the above equation of the ADPCM value $D_n$ represents a maximum integer which does not exceed $d_n/\Delta_n$.

Further, the ADPCM value $D_n$ calculated by the encoder 3 is stored in the memory 8. By repeatedly performing the above process, the analog input signal (the sound signal) is digitally converted into an ADPCM signal, and the ADPCM signal is stored in the memory.

Incidentally, the decoded signal $Y_{n-1}$ one sample before the current time obtained through the decoder 5, the adder 6 and the delay device 7 is obtained as below.

First, the ADPCM value $D_{n-1}$ of a digital value $X_{n-1}$ of the sound signal of one sample ago is decoded in the decoder 5 by using an adaptive quantization rate $\Delta_{n-1}$, so as to become a variation $q_{n-1}$.

$$q_{n-1} = (D_{n-1} + 0.5) \cdot \Delta_{n-1}$$

Thereafter, the variation $q_{n-1}$ outputted from the decoder 5 and a decoded digital value $Y_{n-2}$ of further one sample ago outputted from the delay device 7 are added by the adder 6, and thereby the decoded value $Y_{n-1}$ is calculated.

$$Y_{n-1} = Y_{n-2} + q_{n-1}$$

The decoded value $Y_{n-1}$ obtained in such a manner is delayed by the delay device 7, and the delayed decoded value $Y_{n-1}$ is inputted to the adder 2. Further, the differential value $d_n$ between the delayed decoded value $Y_{n-1}$ and the digital value $X_n$ of the sound signal at the current time is obtained by the adder 2. In the ADPCM encoding apparatus shown in FIG. 1A, the aforesaid process is repeated, so that the encoding operation using the ADPCM method is performed.

Next, the operation of the ADPCM decoding apparatus (the ADPCM decoder) shown in FIG. 1B will be described below. First, in a decoder 10 of the ADPCM decoding apparatus, the ADPCM value $D_n$ of the digital value $X_n$ of the sound signal read out from the memory 8 is decoded by using the adaptive quantization rate $\Delta_n$ inputted from an adaptive quantizing section 9 to calculate a variation $q_n$. Incidentally, similar to the ADPCM encoding apparatus, the adaptive quantization rate $\Delta_n$ is a function of the ADPCM value $D_{n-1}$ of the digital value $X_{n-1}$, and is determined based on the statistical nature of the signal waveform.

$$\Delta_n = \Delta_{n-1} \cdot M(D_{n-1})$$

$$q_n = (D_n + 0.5) \cdot \Delta_n$$

Further, the variation $q_n$ calculated by the decoder 10 and the decoded value $Y_{n-1}$ of one sample ago outputted from a delay device 12 are added by an adder 11 to obtain the decoded value $Y_n$.

$$Y_n = Y_{n-1} + q_n$$

By repeatedly performing the above process, the ADPCM value $D_n$ is read out from the memory 8, and the decoded value $Y_n$ corresponding to the ADPCM value $D_n$ is obtained. Further, the obtained decoded value $Y_n$ is converted into an analog sound signal by the D/A converter 13, and the sound signal is outputted.

Incidentally, the process operation of the ADPCM encoding apparatus and the ADPCM decoding apparatus is described using an example in which the ADPCM value is inputted and outputted through a memory (storage device or a recording device); however, the ADPCM value may also be, for example, an input/output signal with respect to a transmitted/receiver.

Prior Art Documents

Patent Documents
Patent document 1: Japanese Unexamined Patent Application Publication No. 2008-46405
Non-Patent Document
Non-patent document 1: http://www.oki.com/jp/rd/ss/adpcm.html, "ADPCM voice encoding technology"
Non-patent document 2: Tomohiko Uyematsu, "Introduction to Text Data Compression", CQ publishing company, Oct. 15, 1994

DISCLOSURE OF THE INVENTION

Problems to be Solved by the Invention

As described above, ADPCM has been conventionally used as a technique for compressing data volume without degrading the quality sound.

An object of the present invention is to provide an ADPCM encoding apparatus and an ADPCM decoding apparatus capable of further improving the compressibility compared with conventional ADPCM apparatuses, as well as preventing degradation of the sound quality.

Means for Solving the Problems

To achieve the aforesaid object, an ADPCM encoding apparatus according to an aspect of the present invention is adapted to input a sampled PCM signal and obtain a differential value between a signal value of the inputted PCM signal at a predetermined time and a decoded signal value one sample before the signal value to obtain an ADPCM signal, and comprises: a high-frequency measuring section adapted to detect a first signal that indicates a short-period change of the PCM signal; a low-frequency measuring section adapted to detect a second signal that indicates a long-period change of the PCM signal; an adaptive quantizing section adapted to select a function for changing an adaptive quantization characteristic based on the first signal and the second signal, and use the selected function to quantize the differential value, so as convert the differential value into an ADPCM value; and an adaptive inverse-quantizing section adapted to adaptively inverse-quantize the ADPCM value to obtain the decoded signal value.

In the ADPCM encoding apparatus according to the present invention, the adaptive quantizing section may comprise a quantizing section which includes a plurality of registers adapted to overwrite the differential value having been subjected to a predetermined calculation by the selected function, and among the plurality of registers, a part of registers are fixed to zero value, and the bits corresponding to the registers fixed to zero value are deleted, so that the differential value is quantized.

In the ADPCM encoding apparatus according to the present invention, the high-frequency measuring section may comprise a plurality of series-connected delay circuits, and a first arithmetic unit adapted to sum the absolute value of the difference between an input value and an output value of each of the plurality of delay circuits; the low-frequency measuring section may comprise the plurality of series-connected delay circuits, and a second arithmetic unit adapted to sum the output of each of the plurality of delay circuits and divide the summed value by the number of the delay circuits, wherein the plurality of series-connected delay circuits are shared by the high-frequency measuring section and the low-frequency measuring section.

The ADPCM encoding apparatus according to the present invention may further comprise: a first quantizing section and a second quantizing section adapted to quantize the value of the first signal and the value of the second signal respectively, the first quantizing section and the second quantizing section being respectively connected to the output side of the high-frequency measuring section and the output side of the low-frequency measuring section, wherein the adaptive quantizing section changes the adaptive quantization characteristic with respect to the differential value based on the value of the quantized first signal and the value of the quantized second signal respectively outputted from the first quantizing section and the second quantizing section.

The ADPCM encoding apparatus according to the present invention may further comprise a compression-encoding section adapted to compression-encode the ADPCM signal outputted from the adaptive quantizing section.

The ADPCM encoding apparatus according to the present invention may further comprise a framing section adapted to frame the ADPCM signal or the compression-encoded ADPCM signal.

In the ADPCM encoding apparatus according to the present invention, the framing section may frame the ADPCM signal or the compression-encoded ADPCM signal of a predetermined period, and the signals corresponding to the first signal and the second signal of the predetermined period.

To achieve the aforesaid object, an ADPCM decoding apparatus according to another aspect of the present invention is adapted to obtain a PCM signal from an input signal including a compression-encoded ADPCM signal, and comprises: a deframing section adapted to deframe a framed signal and read out the compression-encoded ADPCM signal and a first signal and a second signal, wherein the input signal is the framed signal obtained by framing the first signal and second signal, and the first signal and second signal are adapted to specify the change of an adaptive quantization characteristic for being used when obtaining the compression-encoded ADPCM signal of a predetermined period and the ADPCM signal of the predetermined period, the first signal indicating a short-period change of the PCM signal, the second signal indicating a long-period change of the PCM signal; a compression-decoding section adapted to decode the compression-encoded ADPCM signal and output the decoded ADPCM signal; a selecting section adapted to calculate a selection signal for selecting the adaptive quantization characteristic based on the first and second signals; an adaptive inverse-quantizing section adapted to select an inverse function of the function for changing the adaptive quantization characteristic based on the selection signal, and use the selected inverse function to inverse-quantize the decoded ADPCM signal so as to convert the decoded ADPCM signal into a corresponding differential value; and an adder section adapted to add the differential value and a decoded signal of one sample ago to calculate a decoded signal value corresponding to the differential value, and output the calculated decoded signal value as the PCM signal.

Advantages of the Invention

By using the ADPCM encoding apparatus and the ADPCM decoding apparatus according to the present invention, it is possible to improve the compressibility and obtain good reproduced sound.

BEST MODES FOR CARRYING OUT THE INVENTION

In an ADPCM encoding apparatus according to the present invention, a short-period change (i.e., the frequency) and a long-period change (i.e., the slope) of a PCM signal of a sound signal are detected, and optimal quantization is performed on the PCM signal by changing an adaptive quantization rate (i.e., an adaptive quantization characteristic) according to the combination of the short-period change and the long-period change of the PCM signal. Further, in an ADPCM decoding apparatus according to the present invention, the quantized signal is decoded according to the combination of the short-period change and the long-period change of the PCM signal used in the ADPCM encoding apparatus of the present invention.

By using the aforesaid quantization method, it is possible to increase the quantization rate in the areas with less sound information and decrease the quantization rate in the areas with more sound information. As a result, with the present invention, it is possible to obtain a digital signal with variable bit length (a quantized code). Further, with the present invention, it is possible to compress a digital signal obtained by using a data compression technique capable of handling the code with variable bit length, for example, a reversible data compression technique such as a Huffman encoding method or the like. By using these techniques, data compressibility can be increased, and reproduced sound can be improved.

A concrete configuration example of the present invention will be described below as an embodiment shown in FIGS. 2 to 8. However, the present invention is not limited to this example.

Figure 2:
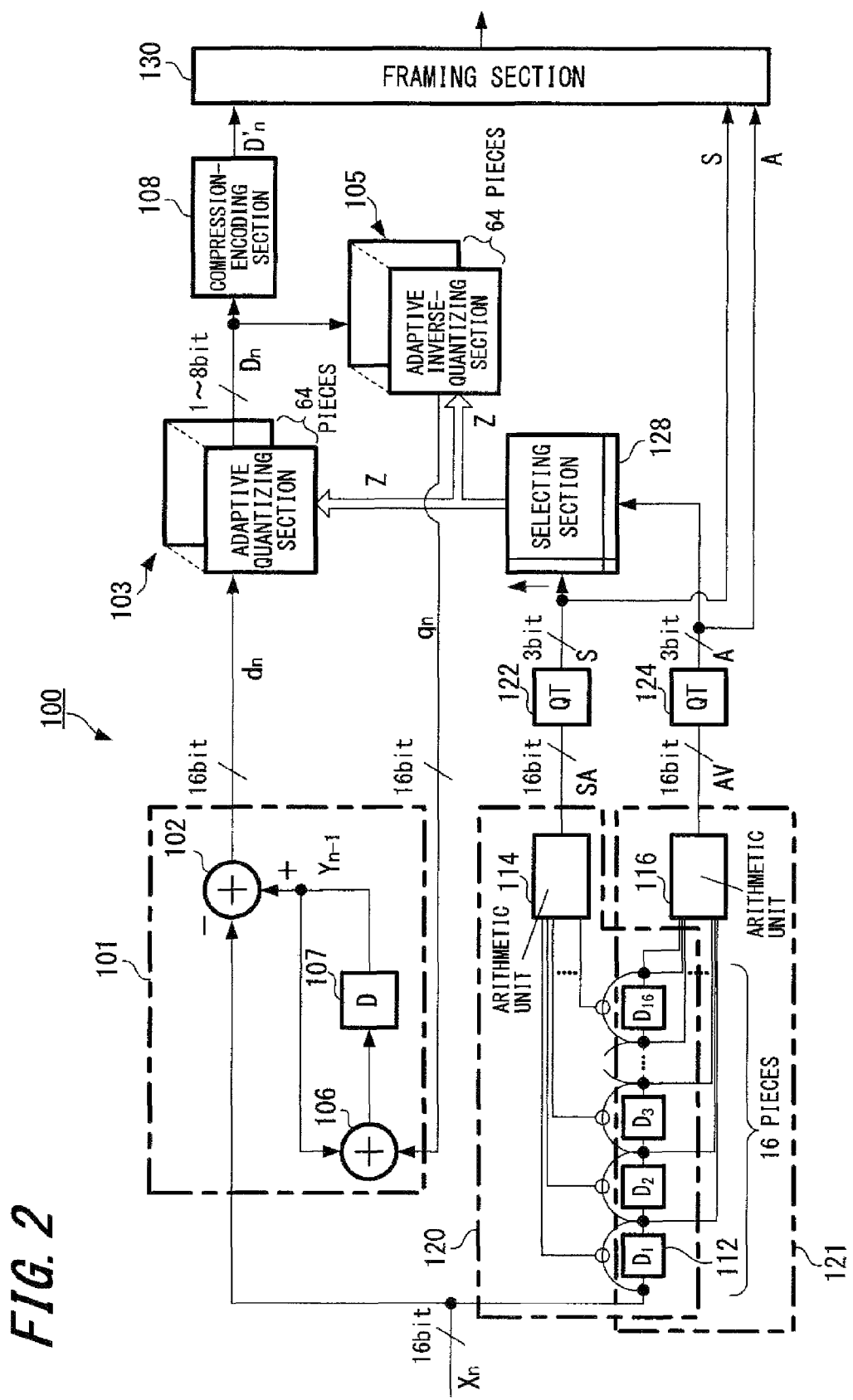
FIG. 2 is a diagram showing a schematic configuration of an ADPCM encoding apparatus according to an embodiment of the present invention.
Figure 3:
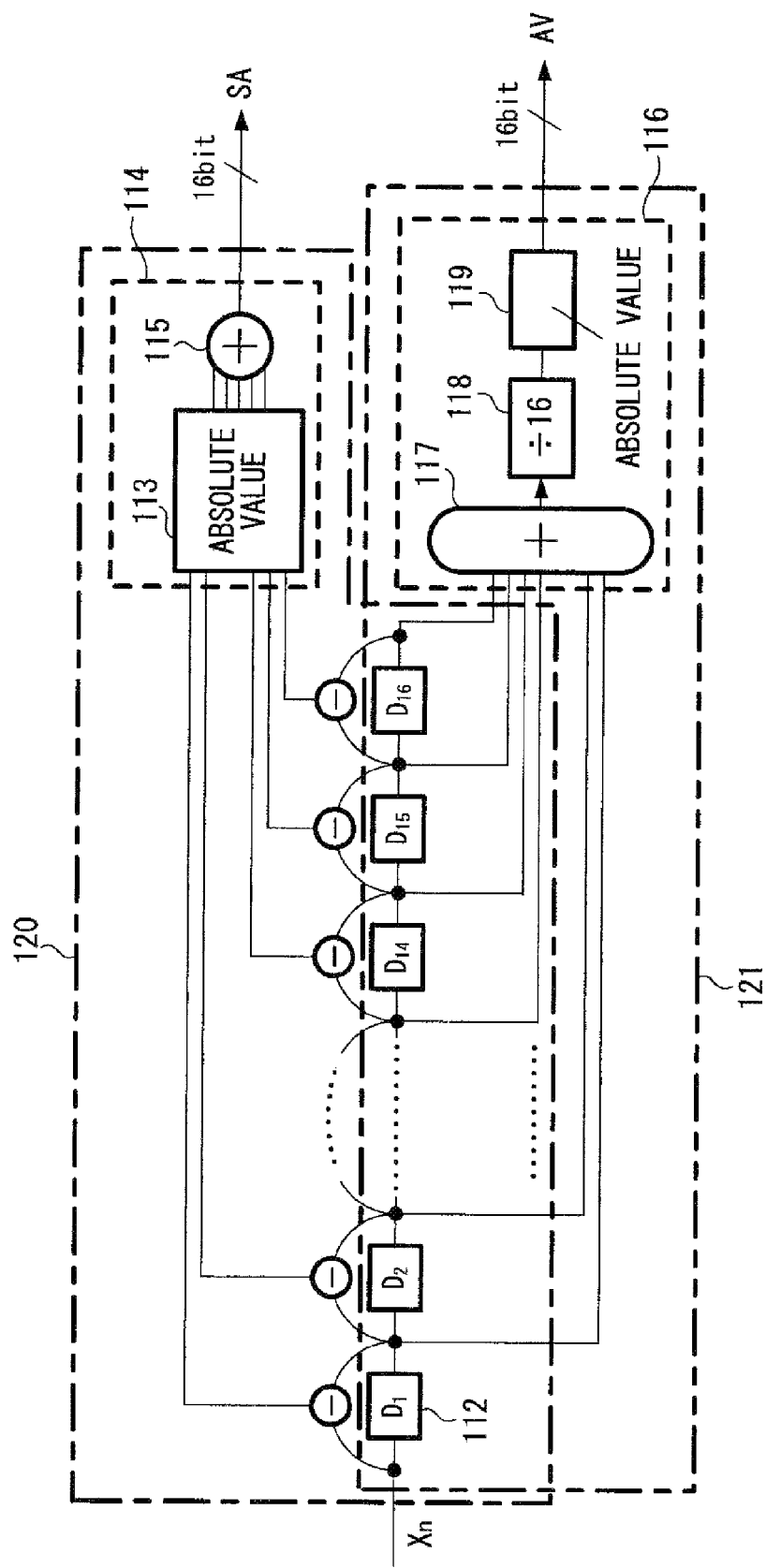
FIG. 3 is a diagram showing a detailed configuration of a high-frequency measuring section and a low-frequency measuring section.
Figure 4A:
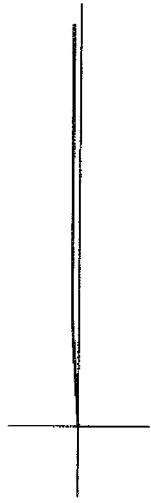
FIGS. 4A to 4D are graphs showing the relation between the signals obtained by the high-frequency measuring section and the low-frequency measuring section and the waveform of an actual sound signal.
Figures 5A, 5B:
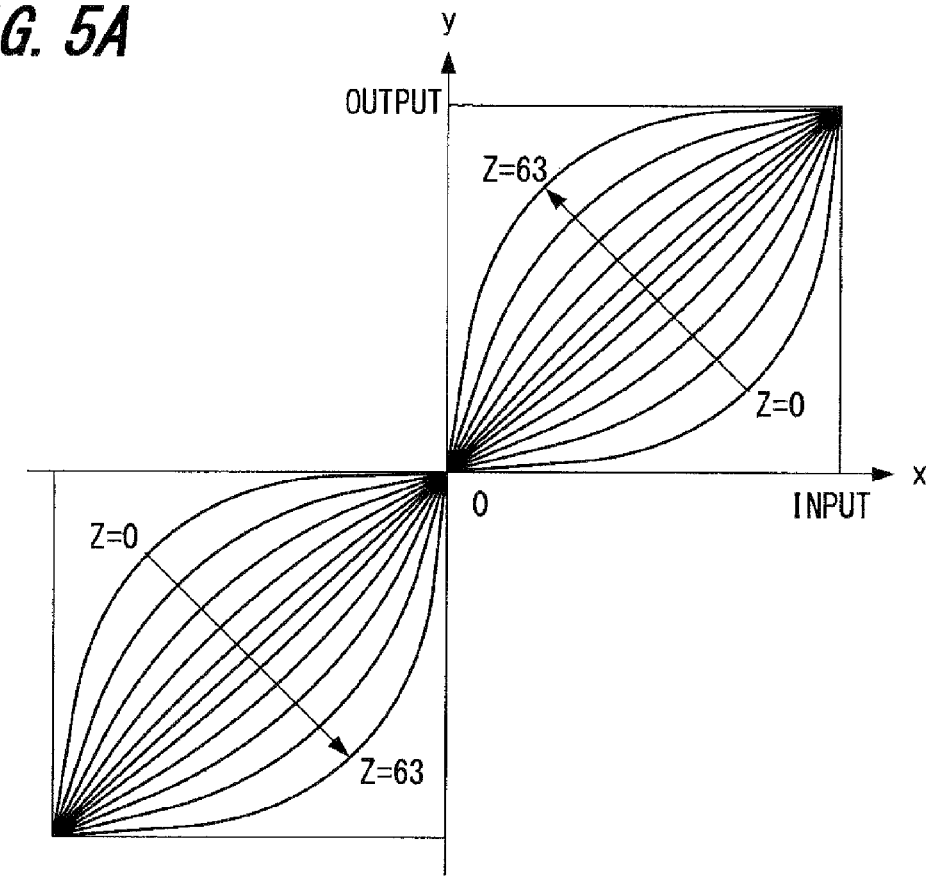
FIG. 5A is a graph showing functions to be used in an adaptive quantizing section.
FIG. 5B is a table showing the relation between signals corresponding to a short-period change, a long-period change of the sound signal outputted from the quantizing section, and selection signals used for selecting the function shown in FIG. 5A.
Figure 6:
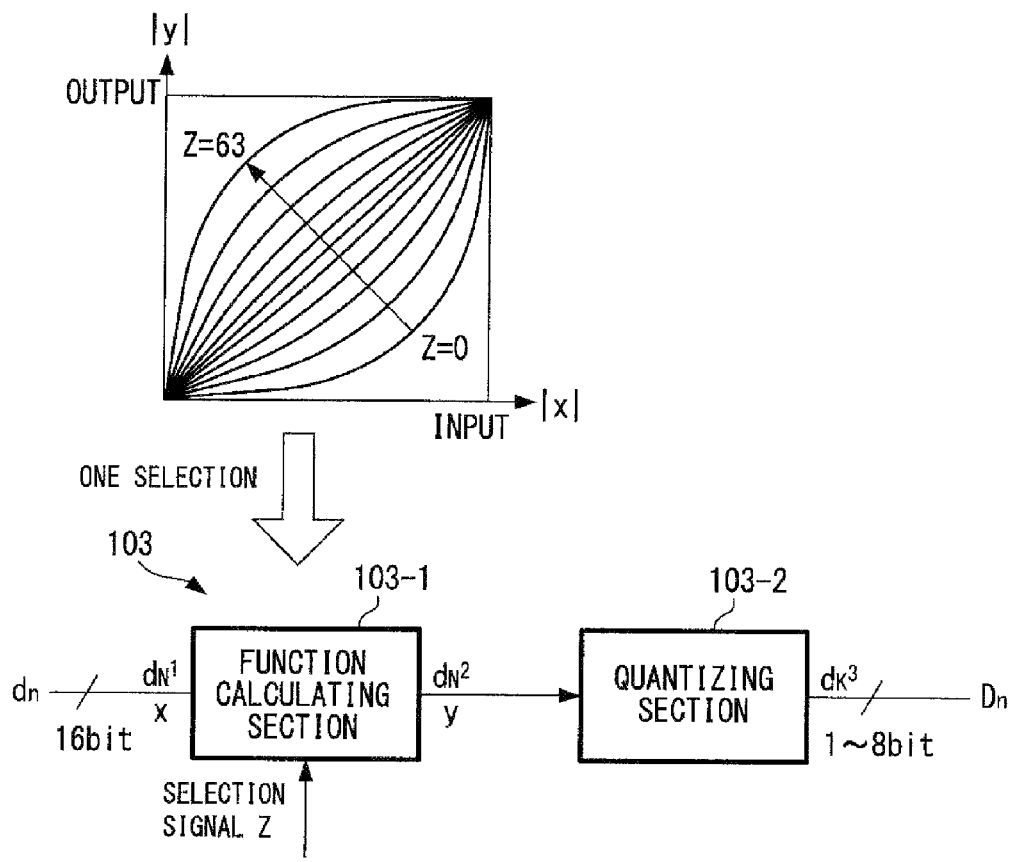
FIG. 6 is a view for explaining the configuration and operation of the adaptive quantizing section.
Figure 6:
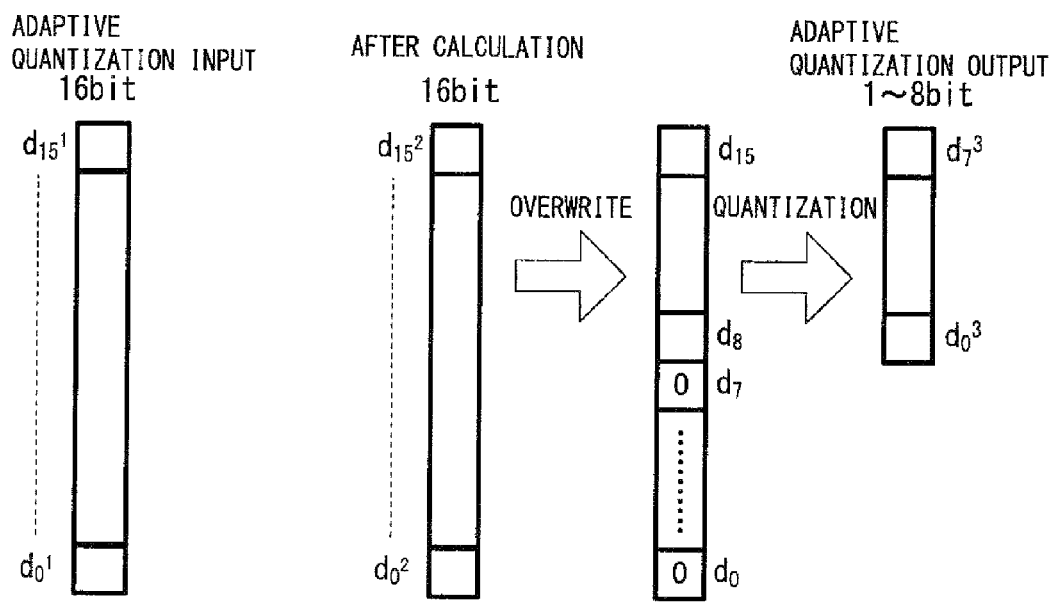
Figure 7:
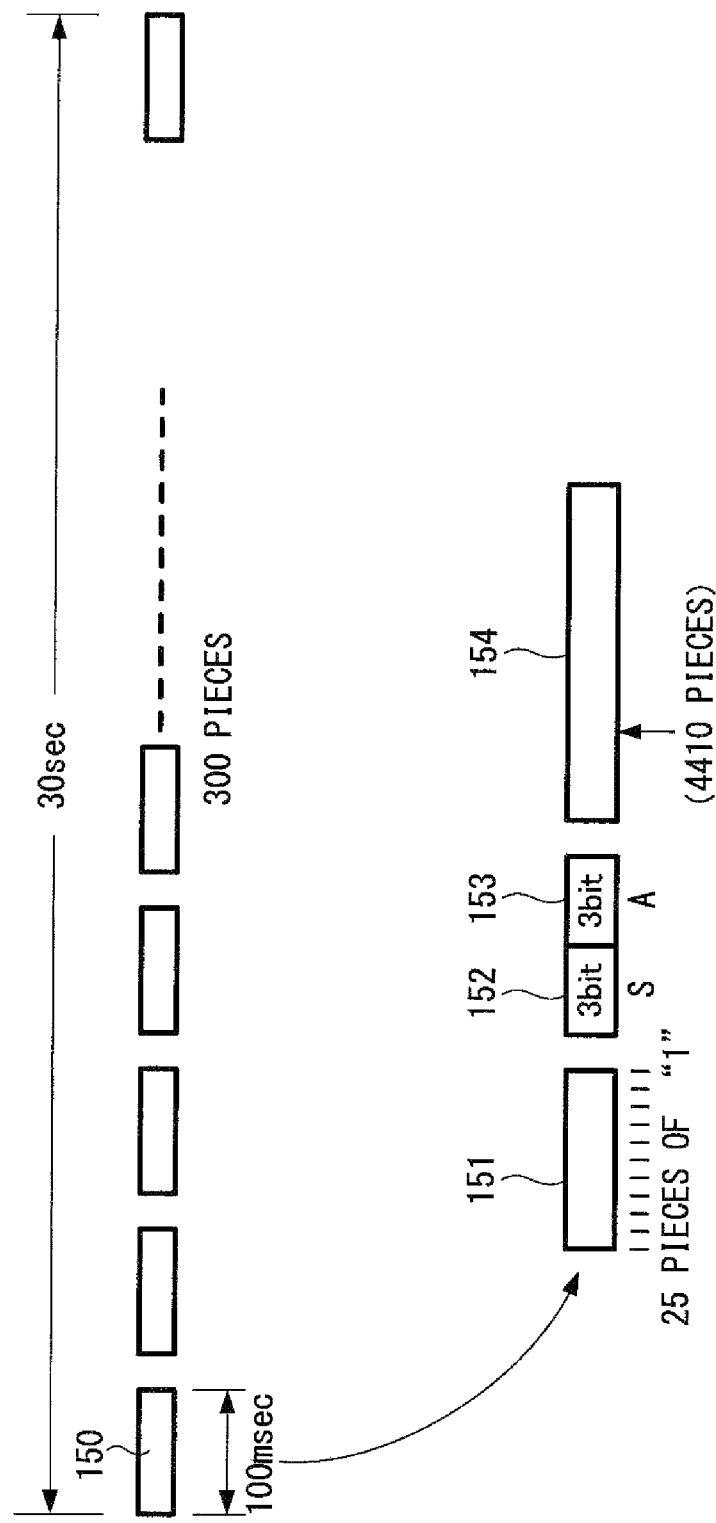
FIG. 7 is a view showing a schematic configuration of framed data outputted from the ADPCM encoding apparatus.
Figure 8:
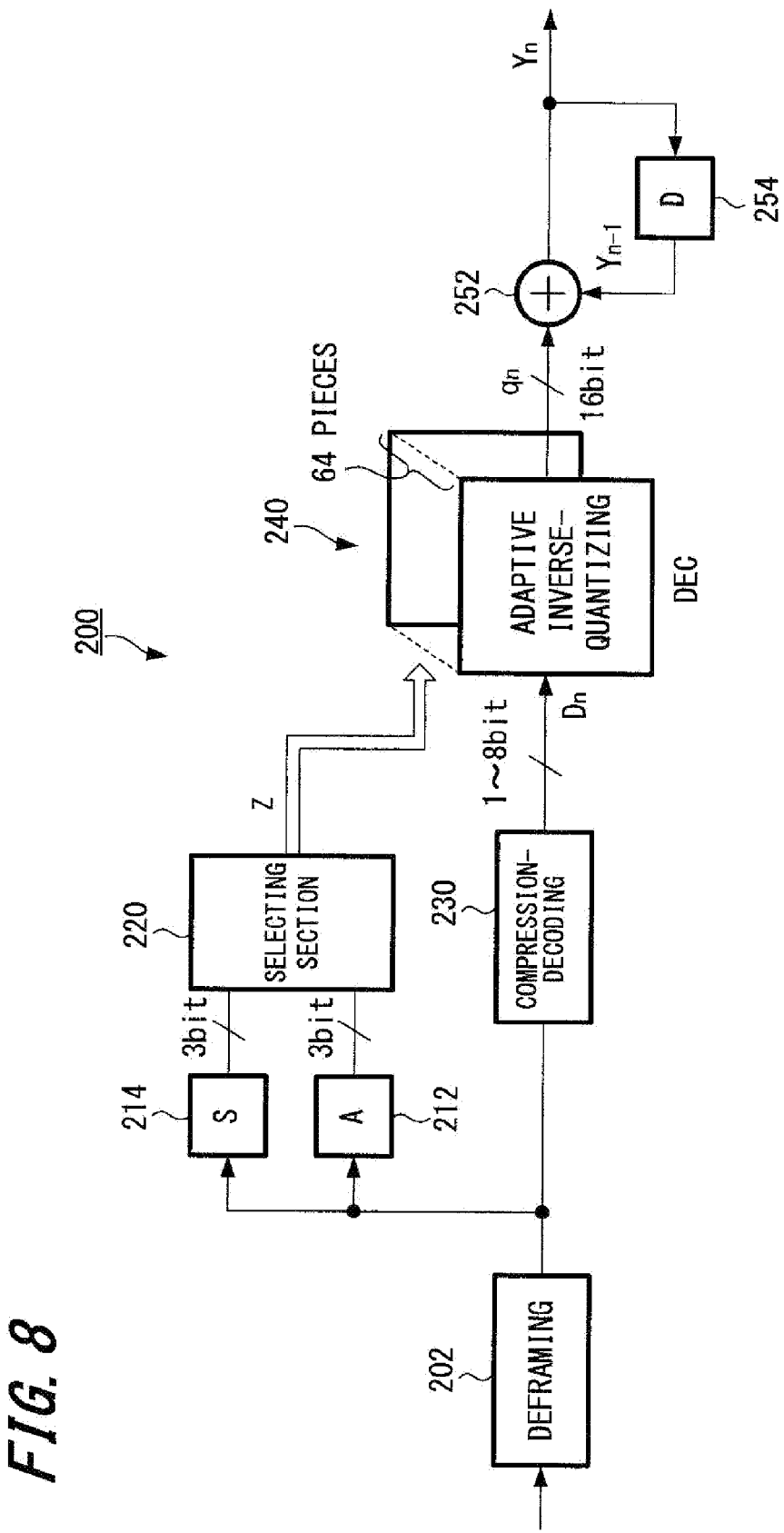
FIG. 8 is a diagram showing a schematic configuration of an ADPCM decoding apparatus according to the aforesaid embodiment of the present invention.

FIG. 2 is a diagram showing a schematic configuration of an ADPCM encoding apparatus according to the embodiment of the present invention. FIG. 3 is a diagram showing a configuration of a high-frequency measuring section and a low-frequency measuring section, wherein the high-frequency measuring section is adapted to detect the signal corresponding to the short-period change (i.e., the frequency) of the sound signal, and the low-frequency measuring section is adapted to detect the signal corresponding to the long-period change (i.e., the slope) of the sound signal. FIGS. 4A to 4D are graphs showing the relation between the signals outputted from the high-frequency measuring section and the low-frequency measuring section and the waveform of an actual sound signal. FIG. 5A is a graph showing functions for obtaining the adaptive quantization rate for being used when performing the adaptive quantization, and FIG. 5B is a table showing the relation between signals outputted from the high-frequency measuring section and the low-frequency measuring section and selection signals used for selecting the functions shown in FIG. 5A. FIG. 6 is a view for explaining the configuration and operation of an adaptive quantizing section 103 shown in FIG. 2. FIG. 7 is a view showing the configuration of framed data outputted from the ADPCM encoding apparatus. FIG. 8 is a diagram showing a schematic configuration of the ADPCM decoding apparatus according to the aforesaid embodiment of the present invention.

<Outline of ADPCM Encoding Apparatus>

First, the configuration and operation of an ADPCM encoding apparatus 100 according to an embodiment of the present invention will be described below with reference to FIG. 2.

<Configuration of ADPCM Encoding Apparatus>

The ADPCM encoding apparatus 100 includes a predictor 101, the adaptive quantizing section 103, an adaptive inverse-quantizing section 105, a compression-encoding section 108, a high-frequency measuring section 120, a low-frequency measuring section 121, two quantizing sections 122 and 124 (i.e., a first quantizing section and a second quantizing section), a selecting section 128, and a framing section 130. The configuration and function of each component will be described below.

The predictor 101 includes a subtractor (an adder section) 102, an adder 106 and a delay circuit 107. A "−" input terminal of the subtractor 102 is connected to an input terminal of a PCM signal $X_n$ of the sound signal, and a "+" input terminal of the subtractor 102 is connected to an output terminal of the delay circuit 107. Further, two input terminals of the adder 106 are respectively connected to the output terminal of the delay circuit 107 and an output terminal of the adaptive inverse-quantizing section 105.

The predictor 101 calculates a differential value $d_n$ between the inputted PCM signal $X_n$ of the sound signal and a decoded signal $Y_{n-1}$ of one sample ago outputted from the delay circuit 107 by the subtractor 102. Further, the predictor 101 outputs the calculated differential value $d_n$ to the adaptive quantizing section 103. Incidentally, the decoded signal $Y_{n-1}$ of one sample ago is calculated by adding a value $q_{n-1}$ and a value $Y_{n-2}$ by the adder 106, wherein the value $q_{n-1}$ is obtained by inverse-quantizing an adaptively quantized value $D_{n-1}$ corresponding to a differential value $d_{n-1}$ of one sample ago by the adaptive inverse-quantizing section 105, and the value $Y_{n-2}$ is a decoded value of two samples ago outputted from the delay circuit 107.

The adaptive quantizing section 103 selects a function for obtaining a predetermined adaptive quantization rate based on a selection signal Z inputted from the selecting section 128, and uses the selected function to quantize (encode) the inputted differential value $d_n$. Further, the adaptive quantizing section 103 outputs an adaptively quantized value $D_n$ (an ADPCM value) to both the compression-encoding section 108 and the adaptive inverse-quantizing section 105. Incidentally, at this time, the adaptive quantizing section 103 outputs a (1 to 8)-bit length-variable ADPCM value $D_n$, for example. The configuration and operation of the adaptive quantizing section 103 will be described later in more detail.

The adaptive inverse-quantizing section 105 inverse-quantizes the ADPCM value $D_n$ inputted from the adaptive quantizing section 103, and outputs the inverse-quantized value $q_n$ to the adder 106 in the predictor 101. Incidentally, since the configuration and operation of the adaptive inverse-quantizing section 105 are identical to those of the ADPCM decoding apparatus (which is to be described later), the details of the configuration and operation of the adaptive inverse-quantizing section 105 will be described later.

The compression-encoding section 108 compression-encodes the ADPCM value $D_n$ inputted from the adaptive quantizing section 103, and outputs the compression-encoded signal $D'_n$ to the framing section 130. Incidentally, compression-encoding methods capable of being applied to a length-variable input signal, such as a Huffman encoding method, can be used in the compression-encoding section 108. The Huffman encoding method and other length-variable compression-encoding techniques are known techniques described in the aforesaid Non-patent document 2, for example.

The high-frequency measuring section 120 detects the short-period change (i.e., the frequency) of the PCM signal $X_n$ of the inputted sound signal, and outputs a signal SA (a first signal) corresponding to the detection result to the quantizing section 122. On the other hand, the low-frequency measuring section 121 detects the long-period change (i.e., the slope) of the PCM signal $X_n$ of the inputted sound signal, and outputs a signal AV (a second signal) corresponding to the detection result to the quantizing section 124. The configuration and operation of the high-frequency measuring section 120 and the low-frequency measuring section 121 will be described later in more detail.

The quantizing section 122 quantizes the value of the signal SA corresponding to the short-period change of the sound signal inputted from the high-frequency measuring section 120, and outputs the quantized value S to both the selecting section 128 and the framing section 130. Further, the quantizing section 124 quantizes the value of the signal AV corresponding to the long-period change of the sound signal inputted from the low-frequency measuring section 121, and outputs the quantized value A to both the selecting section 128 and the framing section 130.

Incidentally, the quantization method used in the quantizing sections 122 and 124 may be either a linear quantization method or a logarithmic quantization method. As described later, the signal S and the signal A outputted from the quantizing sections 122 and 124 respectively are adapted to select the selection signal Z outputted from the selecting section 128 to the adaptive quantizing section 103.

The selecting section 128 selects the selection signal Z of the function based on the signal S and the signal A (the signal corresponding to the short-period change and the signal corresponding to the long-period change of the sound signal) inputted respectively from the quantizing section 122 and the quantizing section 124, the function being used when quantizing (encoding) the differential value $d_n$ in the adaptive quantizing section 103. Further, the selecting section 128 outputs the obtained selection signal Z to the adaptive quantizing section 103 and the adaptive inverse-quantizing section 105.

The framing section 130 frames the compression-encoded signal $D'_n$ inputted from the compression-encoding section 108, the signal S corresponding to the short-period change of the sound signal inputted from the quantizing section 122, and the signal A corresponding to the long-period change of the sound signal inputted from the quantizing section 124 at a predetermined interval. The more detailed configuration and operation of the framing section 130 will be described later.

<Operation of ADPCM Encoding Apparatus>

Next, a sequence of operations of the encoding process of the ADPCM encoding apparatus 100 according to the present embodiment will be described below. Here, as shown in FIG. 2, an example will be described in which a sampled 16-bit PCM signal $X_n$ is inputted.

First, when the PCM signal $X_n$ is inputted to the ADPCM encoding apparatus 100, the predictor 101 (the subtractor 102) calculates the differential value $d_n$ (16 bits) between the PCM signal $X_n$ and the decoded signal $Y_{n-1}$ of one sample ago outputted from the delay circuit 107 in the predictor 101. Thereafter, the predictor 101 (the subtractor 102) outputs the calculated 16-bit differential value $d_n$, to the adaptive quantizing section 103.

Thereafter, the adaptive quantizing section 103 selects the function used for performing the adaptively quantization based on the selection signal Z inputted from the selecting section 128, and changes the adaptive quantization rate (the adaptive quantization characteristic). Further, the adaptive quantizing section 103 uses the selected function to quantize the inputted differential value $d_n$, so as to convert the differential value $d_n$ into the ADPCM value $D_n$.

Note that, at this time, the adaptive quantizing section 103 converts the 16-bit differential value $d_n$ into a (1 to 8)-bit length-variable ADPCM value $D_n$, for example. Further, the adaptive quantizing section 103 outputs the ADPCM value $D_n$ to the compression-encoding section 108 and the adaptive inverse-quantizing section 105. By the above process, in the adaptive quantizing section 103, the differential value $d_n$ is optimally adaptively quantized, and the adaptively quantized length-variable ADPCM value $D_n$ is outputted.

Thereafter, the compression-encoding section 108 compression-encodes the ADPCM value $D_n$ inputted from the adaptive quantizing section 103, and outputs the compression-encoded signal $D'_n$ to the framing section 130. Further, at this time, the quantizing sections 122 and 124 respectively output the signal S corresponding to the short-period change of the sound signal and the signal A corresponding to the long-period change of the sound signal to the framing section 130. The aforesaid process is performed in synchronization with the inputted sampled PCM signal $X_n$.

Figure 1A:
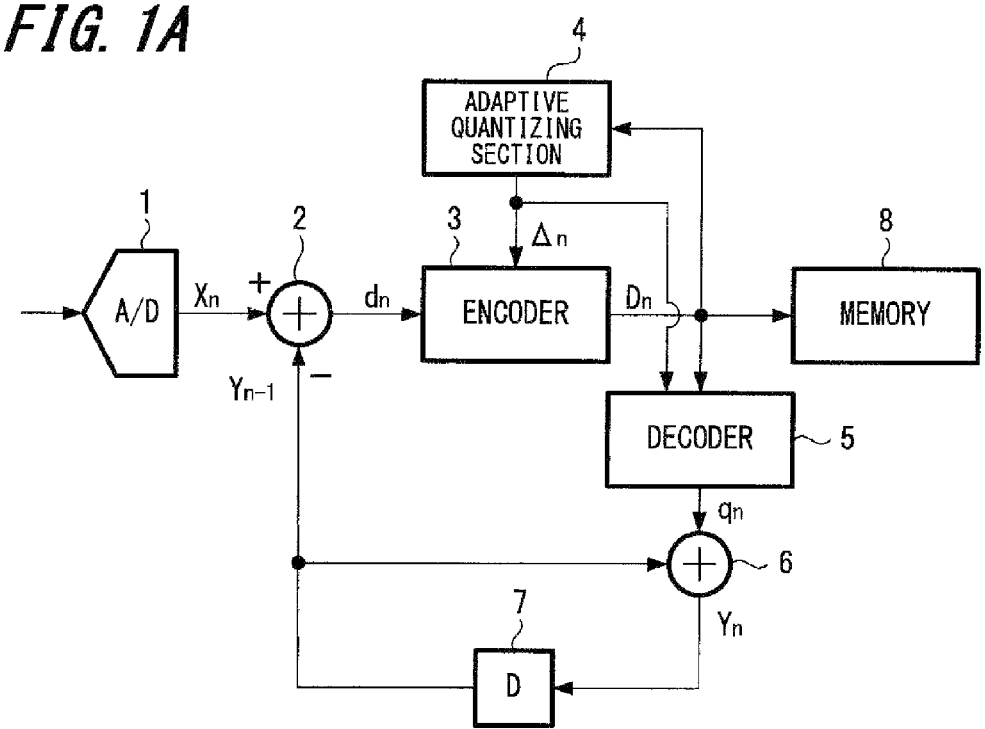
FIGS. 1A and 1B are diagrams respectively showing a configuration of an ADPCM encoding apparatus and a configuration of an ADPCM decoding apparatus according to a prior art.
Figure 1B:
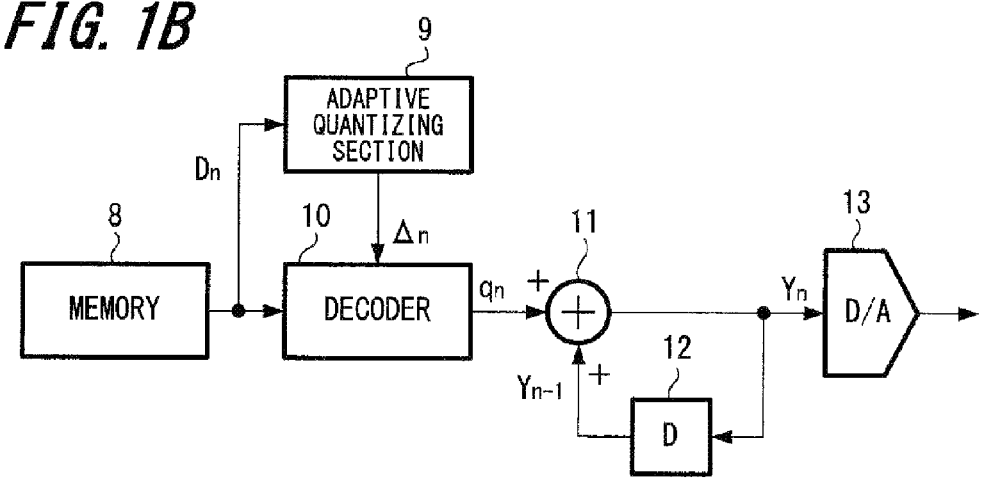

Thereafter, the framing section 130 frames a predetermined number of (a predetermined period of) the compression-encoded signals $D'_n$ (i.e, the framing section 130 makes these signals to one data set), and outputs the framed signals. As described later, at this time, the signal S and signal A inputted from the quantizing sections 122 and 124 are included in the framed data set. Further, similar to the prior art shown in FIG. 1, the data outputted from the framing section 130 may either be stored in a memory, or be transmitted to a receiver of the corresponding ADPCM decoding apparatus by using a transmitter.

By the above process, the adaptively quantization and compression-encoding process is performed on inputted the PCM signal $X_n$ of the sound signal.

<The Configuration and Operation of High-Frequency Measuring Section and Low-Frequency Measuring Section>

Next, the configuration and operation of the high-frequency measuring section 120 and the low-frequency measuring section 121 will be described below with reference to FIG. 3.

The high-frequency measuring section 120 includes sixteen series-connected delay circuits 112 (D1 to D16), and an arithmetic unit 114 (a first arithmetic unit) adapted to sum the absolute values of the input-output differences of the delay circuits 112. The arithmetic unit 114 includes an absolute value calculating section 113 for calculating the absolute value of the input-output difference of each delay circuit 112, and an adder 115 for summing the absolute values of the input-output differences of the sixteen delay circuits 112 calculated by the absolute value calculating section 113.

When the short-period signal, i.e., the high frequency signal, is inputted to the high-frequency measuring section 120 having the aforesaid configuration (in the case where the high frequency signal component is included in the PCM signal $X_n$), the differential value (i.e., the input-output difference) between the input value and the output value of each delay circuit 112 will become large. Thus, in such a case, the sum of the absolute values of the input-output differences of the sixteen delay circuits 112 calculated by the arithmetic unit 114, i.e., the value of the output signal SA, will become large.

In contrast, when the long-period signal, i.e., the low frequency signal, is inputted to the high-frequency measuring section 120 (in the case where the high frequency signal component is not included in the PCM signal $X_n$), the differential value between the input value and the output value of each delay circuit 112 will become small. In such a case, the value of the signal SA outputted from the arithmetic unit 114 will become small too.

In other words, when the high frequency signal is inputted to the high-frequency measuring section 120, the value of the output signal SA of the high-frequency measuring section 120 will become large; and when the low frequency signal is inputted to the high-frequency measuring section 120, the value of the output signal SA of the high-frequency measuring section 120 will become small. Incidentally, in the present embodiment, the value of the signal SA outputted from the high-frequency measuring section 120 is a positive value.

The low-frequency measuring section 121 includes the sixteen series-connected delay circuits 112 and an arithmetic unit 116 (a second arithmetic unit). Incidentally, in the present embodiment, the sixteen delay circuits 112 are shared by the high-frequency measuring section 120 and the low-frequency measuring section 121, as shown in FIG. 3. Incidentally, the present invention is not limited to such configuration, but includes a configuration in which the high-frequency measuring section 120 and the low-frequency measuring section 121 are each provided with a plurality of delay circuits. Further, although the number of the delay circuits 112 is sixteen in the present embodiment, the number of the delay circuits 112 of the present invention is not limited to sixteen but may be any number as long as the short-period change and the long-period change of the PCM signal $X_n$ can be detected.

The arithmetic unit 116 includes an accumulation section 117 adapted to accumulate the signals outputted from the sixteen delay circuits 112, a dividing section 118 adapted to divide the output value of the accumulation section 117 by the number of the delay circuits 112 (here the number of the delay circuits 112 is sixteen), and an absolute value calculating section 119 adapted to calculate the absolute value of the quotient obtained by the dividing section 118. By configuring the arithmetic unit 116 in this manner, the average value of the PCM signal $X_n$ over a predetermined time period can be obtained by the arithmetic unit 116. Incidentally, in the present embodiment, the value of the signal AV outputted from the low-frequency measuring section 121 is a positive value.

In the low-frequency measuring section 121 having the aforesaid configuration, the output value of the dividing section 118 becomes the average value of the sixteen output values outputted from the sixteen delay circuits 112. In other words, the signal AV outputted from the absolute value calculating section 119 is a value obtained by converting the average value of the plurality of output values outputted from the sixteen delay circuits 112 into a positive value.

Thus, when a signal having long period (low frequency) and large amplitude is inputted to the low-frequency measuring section 121, since the signal value outputted from each delay circuit 112 is substantially the same and large, the average value (the output signal AV) of the signal values outputted from the delay circuits 112 is large. In contrast, when a signal having short period (high frequency) and large amplitude is inputted to the low-frequency measuring section 121, the sixteen signal values outputted from the sixteen delay circuits 112 are a mixture of positive value(s) and negative value(s). In such a case, the average value (the output signal AV) of the signal values outputted from the delay circuits 112 is small.

In other words, when the low frequency signal is inputted to the low-frequency measuring section 121 of the present embodiment, the value of the signal AV outputted from the low-frequency measuring section 121 will become large; and when the high frequency signal is inputted to the low-frequency measuring section 121, the value of the signal AV outputted from the low-frequency measuring section 121 will become small.

The value (16-bit) of the signal SA and the value (16-bit) of the signal AV respectively outputted from the high-frequency measuring section 120 and the low-frequency measuring section 121 in the aforesaid manner are inputted to the quantizing section 122 and the quantizing section 124 respectively as shown in FIG. 2. The quantizing section 122 quantizes the value of the inputted 16-bit signal SA into a 3-bit signal, and outputs the quantized signal S to the selecting section 128. On the other hand, the quantizing section 124 quantizes the value of the inputted 16-bit signal AV into a 3-bit signal, and outputs the quantized signal A to the selecting section 128.

Further, as described above, in the ADPCM encoding apparatus 100 according to the present embodiment, the value of the signal S and the value of the signal A respectively outputted from the quantizing section 122 and the quantizing section 124 are combined with each other to select the function for being used when adaptively quantizing the PCM signal $X_n$. In other words, in the present embodiment, actually the value of the signal SA and the value of the signal AV respectively outputted from the high-frequency measuring section 120 and the low-frequency measuring section 121, i.e., the short-period change and the long-period change of the PCM signal $X_n$, are combined with each other to adaptively quantize the PCM signal $X_n$.

<Relation Between Short-Period Change and Long-Period Change of Sound Signal and Adaptively Quantization>

The relation between the value of the signal SA and the value of the signal AV calculated by the high-frequency measuring section 120 and the low-frequency measuring section 121 respectively, and the adaptive quantization characteristic will be described below with reference to the attached drawings.

The relation between the value of the output signal SA from the high-frequency measuring section 120, the value of the output signal AV from the low-frequency measuring section 121, and the waveform of the actual sound signal is shown in FIGS. 4A to 4D.

In the case where the value of the output signal SA is small (a value close to 0) and the value of the output signal AV is also small (a value close to 0), the short-period change and the long-period change of the PCM signal $X_n$ are both small. Thus, in such a case, as shown in FIG. 4A, the waveform of the actual sound signal is a waveform whose amplitude value is close to 0, and the variation of the amplitude of the waveform is also small.

Figure 4B:
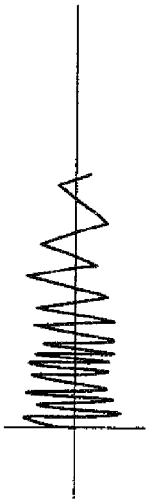

In the case where the value of the output signal SA is large but the value of the output signal AV is small (a value close to 0), since the short-period change of the PCM signal $X_n$ becomes large, the waveform of the actual sound signal is a random waveform as shown in FIG. 4B.

Figure 4C:
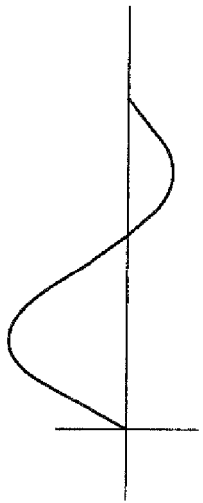

Further, in the case where the value of the output signal SA is small (a value close to 0) but the value of the output signal AV is large, the short-period change of the PCM signal $X_n$ will be small and the long-period change of the PCM signal $X_n$ will be large. Thus, in such a case, the waveform of the actual sound signal will be a waveform whose amplitude varies slowly as shown in FIG. 4C.

Figure 4D:
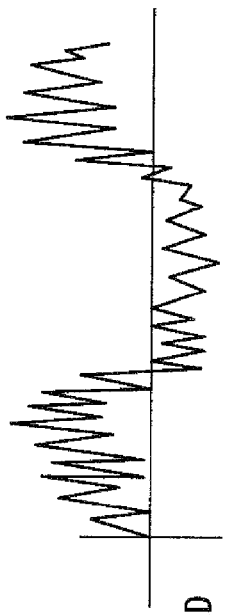

Further, in the case where the value of the output signal SA is large and the value of the output signal AV is also large, the waveform of the actual sound signal will be a waveform obtained by superimposing a waveform whose amplitude varies randomly on a waveform whose amplitude varies slowly as shown in FIG. 4D.

In the present embodiment, the function for being used when adaptively quantizing the differential value $d_n$ by the adaptive quantizing section 103 is determined by considering the relation between the aforesaid short-period change (the signal SA), the long-period change (the signal AV), and the waveform of the actual sound signal. Incidentally, as described below, the function for being used when adaptively quantizing the differential value $d_n$ by the adaptive quantizing section 103 is actually determined based on the signal S and the signal A which are obtained by quantizing the signal SA and the signal AV by the quantizing section 122 and the quantizing section 124 respectively.

In the adaptive quantizing section 103 according to the present embodiment, 64 pieces of functions are prepared, and for each function, the value of the output signal y (vertical axis) varies with respect to the value the input signal x (horizontal axis), as shown in FIG. 5A. Incidentally, for each of the 64 pieces of functions, the variation of the value of the output signal y with respect to the value of the input signal x is symmetric about the origin, and an output signal y of positive or negative value is outputted with respect to an input signal x of positive or negative value.

Further, the "Z" in FIG. 5A represents the value (0 to 63) of the selection signal of the function determined by the signal S (the signal corresponding to the short-period change of the sound signal) and the signal A (the signal corresponding to the long-period change of the sound signal). Further, the values of the selection signal Z and the functions selected by the adaptive quantizing section 103 correspond to each other one by one.

For example, when the absolute value of the input signal x is small, the function corresponding to the selection signal Z=0 in FIG. 5A has a value close to 0, and the variation of the output signal y with respect to the input signal x is small. Further, for the function corresponding to the selection signal Z=0, when the absolute value of the input signal x becomes large, the variation of the absolute value of the output signal y with respect to the absolute value of the input signal x also becomes large.

Contrary to the function corresponding to the selection signal Z=0, for the function corresponding to the selection signal Z=63 in FIG. 5A, when the absolute value of the input signal x is small, the variation of the absolute value of the output signal y with respect to the absolute value of the input signal x is large. Further, for the function corresponding to the selection signal Z=63, when the absolute value of the input signal x becomes large, the variation of the absolute value of the output signal y with respect to the absolute value of the input signal x becomes small.

Furthermore, the function corresponding to the selection signal Z=32 in FIG. 5A is an intermediate function between the function corresponding to the selection signal Z=0 and the function corresponding to the selection signal Z=63; and for the function corresponding to the selection signal Z=32, the output signal y varies linearly with respect to the input signal x, so that the value of the input signal x and the value of the output signal y are the same.

The table of FIG. 5B shows the relation between the value (0 to 7) of the 3-bit signal S and the value (0 to 7) of the 3-bit signal A respectively outputted from the quantizing section 122 and the quantizing section 124, and the value (0 to 64) of the selection signal Z selected based on the combination of the value of the signal S and the value of the signal A. The table data is stored in the selecting section 128, and the selecting section 128 uses the table to select the selection signal Z based on the inputted signal S and signal S and output the selected selection signal Z.

For example, in the case where the combination of the signal S and signal A is [S, A]=[3, 1], the value of the selection signal Z will be [24], so that the function corresponding to the selection signal Z=24 will be used in the adaptive quantizing section 103. Incidentally, in the selection example of the selection signal Z shown in FIG. 5B, the selection signals Z=(4 to 60) are selected among the selection signals Z=(0 to 63) shown in FIG. 5A; however, the present invention is not limited to this example, but other selection examples can be applied.

In the selection example of the selection signal Z shown in FIG. 5B, under the condition that the value of the signal A is constant, if the value of the signal S corresponding to the short-period change of the PCM signal (the sound signal) becomes larger, a function corresponding to a smaller selection signal Z will be selected. In such a case, in the selected function, since the slope of the function becomes large in the area where the absolute value of the input signal x is large, an extended output signal y can be obtained in the area where the absolute value of the input signal x is large.

On the other hand, in the selection example of the selection signal Z shown in FIG. 5B, under the condition that the value of the signal S is constant, if the value of the signal A corresponding to the long-period change of the PCM signal (the sound signal) becomes larger, a function corresponding to a larger selection signal Z will be selected. In such a case, for the selected function, since the slope of the function becomes large in the area where the absolute value of the input signal x is small, an extended output signal y can be obtained in the area where the absolute value of the input signal x is small.

Further, in the selection example of the selection signal Z shown in FIG. 5B, when the value of the signal S and the value of the signal A are the same, a function corresponding to the selection signal Z=32, i.e, a function which makes the value of the input signal x and the value of the output signal y equal to each other, will be selected.

<Adaptive Quantizing Section>

Next, the configuration of the adaptive quantizing section 103 will be described in more detail with reference to FIG. 6. As shown in FIG. 6, the adaptive quantizing section 103 has a function calculating section 103-1 and a quantizing section 103-2.

The function calculating section 103-1 uses a function corresponding to the value of the selection signal Z inputted from the selecting section 128 to perform a predetermined calculation on the differential value $d_n$ ($d_N^1$: N=0 to 15) inputted from the predictor 101. Further, the function calculating section 103-1 outputs the calculated differential value $d_N^2$ to the quantizing section 103-2.

The quantizing section 103-2 quantizes the differential value $d_N^2$ inputted from the function calculating section 103-1, wherein the differential value $d_N^2$ has been subjected to the predetermined calculation. Further, the quantized differential value $d_K^3$ (K=0 to 7) is outputted to the compression-encoding section 108.

Next, the content of the adaptively quantization process of the adaptive quantizing section 103 will be described in more detail. Here, an example will be described in which the differential value $d_n$ inputted from the predictor 101 is a 16-bit data column ($d_0^1$ to $d_{15}^1$).

First, the function calculating section 103-1 uses a function selected based on the selection signal Z to perform a predetermined calculation on the 16-bit differential value $d_n$ ($d_N^1$: N=0 to 15) inputted from the predictor 101. Further, the function calculating section 103-1 outputs the 16-bit differential value $d_N^2$ obtained by performing the aforesaid calculation to the quantizing section 103-2.

Thereafter, the quantizing section 103-2 overwrite the 16-bit differential value $d_N^2$ in a 16-bit register having lower 8 indexes of bit information fixed to "0", for example. Thereafter, the quantizing section 103-2 removes the lower 8 indexes of bit information fixed to "0" from the overwritten 16-bit information. Further, the quantizing section 103-2 outputs the remaining upper 8 indexes of bit information ($d_0^3$ to $d_7^3$) to the compression-encoding section 108. However, if all bit information is "0" at this time, the quantizing section 103-2 outputs "0" of 1 bit.

In the adaptive quantizing section 103, as described above, the 16-bit differential value $d_n$ inputted from the predictor 101 is quantized, and a (1 to 8)-bit length-variable ADPCM value $D_n$ is outputted. Thereafter, the ADPCM value $D_n$ outputted from the adaptive quantizing section 103 is compression-encoded by the compression-encoding section 108, and the compression-encoded signal $D'_n$ is outputted to the framing section 130.

The aforesaid quantization process in the adaptive quantizing section 103 is performed in synchronization with the sampling period of the sampled PCM signal $X_n$ inputted to the ADPCM encoding apparatus 100. Further, the compression-encoding process in the compression-encoding section 108 is also performed in synchronization with the sampling period of the sampled PCM signal $X_n$, and the compression-encoded ADPCM value $D'_n$ is outputted for each sampled PCM signal $X_n$.

<Framing Section>

Next, the concrete process of the framing section 130 will be described with reference to FIG. 7. According to the present embodiment, as described above, the adaptively quantized and compression-encoded signal $D'_n$ is brought together (i.e., is framed) for each predetermined time period in the framing section 130, and then outputted. In the example shown in FIG. 7, a sound signal of 30 seconds is inputted, and a compression-encoded signal $D'_n$ is framed and outputted every 100 milliseconds.

As shown in FIG. 7, in the case where a sound signal of 30 seconds is inputted, 300 pieces of 100-millisecond frame data 150 is outputted, each frame data 150 including the compression-encoded signal $D'_n$.

Each frame data 150 includes a head section 151, an S signal section 152, an A signal section 153, and a signal section 154. Incidentally, 25 pieces of "1" are continuously stored in the head section 151. Further, the compression-encoded ADPCM value $D'_n$ with respect to the 100-millisecond input signal (4410 signals when sampling frequency is 44.1 kHz) is stored in the signal section 154.

Further, the information of the signal S (3-bit signal) and the information of the signal A (3-bit signal) for specifying the function for being applied when obtaining the 100-millisecond ADPCM value $D'_n$ are respectively stored in the S signal section 152 and the A signal section 153. In the present embodiment, in the case where the ADPCM value $D'_n$ is framed and outputted, the period (for example, 100 milliseconds in the example shown in FIG. 7) corresponding to the number of the framed signals is adapted to convert (i.e., to adaptively quantize) the input signal using the same function. In other words, the function for being used in the adaptive quantizing section 103 is updated for each number of framed signals (i.e., for each frame). In such a manner, a great number of the compression-encoded ADPCM values $D'_n$ are framed, and thereby it is not necessary to output the information for selecting the function for each compression-encoded ADPCM value $D'_n$.

The present embodiment is described using the example in which the compression-encoded ADPCM value $D'_n$ is framed every 100 milliseconds in the framing section 130; however, the framing period (the number of the framed ADPCM values) is not limited to such example.

<ADPCM Decoding Apparatus>

Next, the configuration and operation of an ADPCM decoding apparatus 200 according to the present embodiment will be described below with reference to FIG. 8.

(1) Configuration of ADPCM Decoding Apparatus

The ADPCM decoding apparatus 200 includes a deframing section 202, a compression-decoding section 230, an adaptive inverse-quantizing section 240, an adder circuit 252, a delay circuit 254, two registers 212 and 214, and a selecting section 220.

The deframing section 202 reads out the information of the head section of the inputted frame data to recognize the frame. Further, the deframing section 202 reads out the information of the S signal section and the A signal section in the frame. Furthermore, the deframing section 202 reads out the compression-encoded ADPCM value $D'_n$ stored in the signal section in the frame.

The compression-decoding section 230 decodes the inputted compression-encoded ADPCM value $D'_n$. The adaptive inverse-quantizing section 240 inverse-quantizes the ADPCM value $D_n$ decoded by the compression-decoding section 230 to convert the ADPCM value $D_n$ into a corresponding differential value $q_n$.

The adder circuit 252 adds the differential value $q_n$ inputted from the adaptive inverse-quantizing section 240 and the decoded signal $Y_{n-1}$ of one sample ago inputted from the delay circuit 254 to calculate the decoded signal value $Y_n$ corresponding to the differential value $q_n$.

The two registers 212 and 214 output the information of the inputted signal S and signal A to the selecting section 220, and keep the information for one frame (i.e., 100 milliseconds). Based on the information of the inputted signal S and signal A, the selecting section 220 calculates the selection signal for selecting the function for being used in the adaptive inverse-quantizing section 240.

(2) Opearion of ADPCM Decoding Apparatus

Next, a sequence of operations of the decoding process of the ADPCM decoding apparatus 200 according to the present embodiment will be described below. First, when the framed and compression-encoded ADPCM value $D'_n$ is inputted to the ADPCM decoding apparatus 200, the deframing section 202 reads out the information of the head section to recognize the frame.

Further, the deframing section 202 reads out the 3-bit information of the S signal section and the A signal section, and reads out the (1 to 8)-bit compression-encoded ADPCM value $D'_n$. Further, the deframing section 202 outputs the read out 3-bit information of the S signal section and the A signal section to the selecting section 220 through the registers 212 and 214. Further, at the same time, the deframing section 202 outputs the read out compression-encoded ADPCM value $D'_n$ to the compression-decoding section 230.

Thereafter, the selecting section 220 calculates the selection signal Z for determining the function for being used in the adaptive inverse-quantizing section 240 based on the information of the inputted signal S and signal A, and outputs the selection signal Z to the adaptive inverse-quantizing section 240. Incidentally, the function used in the adaptive inverse-quantizing section 240 is the inverse function of the function used for performing the encoding operation in the ADPCM encoding apparatus.

The compression-decoding section 230 decodes the compression-encoded ADPCM value $D'_n$ to generate an ADPCM value $D_n$ and outputs the generated signal to the adaptive inverse-quantizing section 240.

Thereafter, the adaptive inverse-quantizing section 240 uses the inverse function of the function used when encoding the ADPCM value $D_n$ to inverse-quantize the decoded ADPCM value $D_n$, and generates a corresponding differential value $q_n$. Thereafter, the adaptive inverse-quantizing section 240 outputs the generated differential value $q_n$ to the adder circuit 252. Incidentally, since the operation of the adaptive inverse-quantizing section 240 is the reverse of the operation of the adaptive quantizing section 103 having been described with reference to FIG. 6, and the configuration of the adaptive inverse-quantizing section 240 is configured to perform the reverse of the operation of the adaptive quantizing section 103, the description of the configuration and the operation of the adaptive inverse-quantizing section 240 will be omitted here.

Further, the adder circuit 252 adds the decoded differential value $q_n$ and the decoded signal $Y_{n-1}$ of one sample ago inputted from the delay circuit 254 to calculate a PCM code $Y_n$, and outputs the PCM code $Y_n$.

As described above, in the ADPCM decoding apparatus 200 according to the present embodiment, the framed and compression-encoded ADPCM value $D'_n$ is decoded to obtain the PCM code $Y_n$.

<Other Embodiments>

In the aforesaid embodiment, the framing process is performed after the ADPCM value $D_n$ has been compression-encoded; however, the present invention is not limited thereto. For example, by adopting a configuration in which a fixed-length ADPCM value $D_n$, instead of the length-variable ADPCM value $D_n$ as in the present embodiment, is outputted when performing the adaptively quantization, the ADPCM value $D_n$ can be directly framed.

Further, a configuration may alternatively be adopted in which the process of framing the input signal is not necessarily needed, and the data (i.e., the selection signal Z) for selecting the function to be used when performing the adaptively quantization is synchronously transmitted from an ADPCM adaptive encoding apparatus to an ADPCM adaptive decoding apparatus.

Explanation of Reference Numerals

100 ADPCM encoding apparatus
    101 predictor
    102 subtractor
    103 adaptive quantizing section
    105, 240 adaptive inverse-quantizing section
    106, 252 adder
    107, 112, 254 delay circuit
    108 compression-encoding section
    114, 116 arithmetic unit
    120 high-frequency measuring section
    121 low-frequency measuring section
    122, 124 quantizing section
    128, 220 selecting section
    130 framing section
    200 ADPCM decoding apparatus
    202 deframing section
    212, 214 register
    230 compression-decoding section

The invention claimed is:

1. An ADPCM encoding apparatus, adapted to input a sampled PCM signal and obtain a differential value between a signal value of the inputted PCM signal at a predetermined time and a decoded signal value one sample before the signal value to obtain an ADPCM signal, comprising:

a high-frequency measuring section adapted to detect a first signal that indicates a short-period change of the PCM signal;

a low-frequency measuring section adapted to detect a second signal that indicates a long-period change of the PCM signal;

an adaptive quantizing section adapted to select a function for changing an adaptive quantization characteristic based on the first signal and the second signal, and use the selected function to quantize the differential value, so as convert the differential value into an ADPCM value; and an adaptive inverse-quantizing section adapted to adaptively inverse-quantize the ADPCM value to obtain the decoded signal value, wherein the adaptive quantizing section comprises a quantizing section which includes a plurality of registers adapted to overwrite the differential value having been subjected to a predetermined calculation by the selected function, and among the plurality of registers, a part of registers are fixed to zero value, and the bits corresponding to the registers fixed to zero value are deleted, so that the differential value is quantized.

2. An ADPCM encoding apparatus adapted to input a sampled PCM signal and obtain a differential value between a signal value of the inputted PCM signal at a predetermined time and a decoded signal value one sample before the signal value to obtain an ADPCM signal, comprising:

a high-frequency measuring section adapted to detect a first signal that indicates a short-period change of the PCM signal;

a low-frequency measuring section adapted to detect a second signal that indicates a long-period change of the PCM signal;

an adaptive quantizing section adapted to select a function for changing an adaptive quantization characteristic based on the first signal and the second signal, and use the selected function to quantize the differential value, so as convert the differential value into an ADPCM value; and an adaptive inverse-quantizing section adapted to adaptively inverse-quantize the ADPCM value to obtain the decoded signal value, wherein the high-frequency measuring section comprises a plurality of series-connected delay circuits, and a first arithmetic unit adapted to sum the absolute value of the difference between an input value and an output value of each of the plurality of delay circuits, wherein the low-frequency measuring section comprises the plurality of series-connected delay circuits, and a second arithmetic unit adapted to sum the output of each of the plurality of delay circuits and divide the summed value by the number of the delay circuits, and wherein the plurality of series-connected delay circuits are shared by the high-frequency measuring section and the low-frequency measuring section.

3. The ADPCM encoding apparatus according to claim 2, further comprising:

a first quantizing section and a second quantizing section adapted to quantize the value of the first signal and the value of the second signal respectively, the first quantizing section and the second quantizing section being respectively connected to the output side of the high-frequency measuring section and the output side of the low-frequency measuring section, wherein the adaptive quantizing section changes the adaptive quantization characteristic with respect to the differential value based on the value of the quantized first signal and the value of the quantized second signal respectively outputted from the first quantizing section and the second quantizing section.

4. An ADPCM encoding apparatus adapted to input a sampled PCM signal and obtain a differential value between a signal value of the inputted PCM signal at a predetermined time and a decoded signal value one sample before the signal value to obtain an ADPCM signal, comprising:

a high-frequency measuring section adapted to detect a first signal that indicates a short-period change of the PCM signal;

a low-frequency measuring section adapted to detect a second signal that indicates a long-period change of the PCM signal;

an adaptive quantizing section adapted to select a function for changing an adaptive quantization characteristic based on the first signal and the second signal, and use the selected function to quantize the differential value, so as convert the differential value into an ADPCM value;

an adaptive inverse-quantizing section adapted to adaptively inverse-quantize the ADPCM value to obtain the decoded signal value; and a compression-encoding section adapted to compression-encode the ADPCM signal outputted from the adaptive quantizing section.

5. An ADPCM encoding apparatus adapted to input a sampled PCM signal and obtain a differential value between a signal value of the inputted PCM signal at a predetermined time and a decoded signal value one sample before the signal value to obtain an ADPCM signal, comprising:

a high-frequency measuring section adapted to detect a first signal that indicates a short-period change of the PCM signal;

a low-frequency measuring section adapted to detect a second signal that indicates a long-period change of the PCM signal;

an adaptive quantizing section adapted to select a function for changing an adaptive quantization characteristic based on the first signal and the second signal, and use the selected function to quantize the differential value, so as convert the differential value into an ADPCM value;

an adaptive inverse-quantizing section adapted to adaptively inverse-quantize the ADPCM value to obtain the decoded signal value; and a framing section adapted to frame the ADPCM signal or the compression-encoded ADPCM signal.

6. The ADPCM encoding apparatus according to claim 5, wherein the framing section frames the ADPCM signal or the compression-encoded ADPCM signal of a predetermined period, and the signals corresponding to the first signal and the second signal of the predetermined period.

7. An ADPCM decoding apparatus adapted to obtain a PCM signal from an input signal including a compression-encoded ADPCM signal, comprising:

a deframing section adapted to deframe a framed signal and read out the compression-encoded ADPCM signal and a first signal and a second signal, wherein the input signal is the framed signal obtained by framing the first signal and second signal, and the first signal and second signal are adapted to specify the change of an adaptive quantization characteristic for being used when obtaining the compression-encoded ADPCM signal of a predetermined period and the ADPCM signal of the predetermined period, the first signal indicating a short-period change of the PCM signal, the second signal indicating a long-period change of the PCM signal;

a compression-decoding section adapted to decode the compression-encoded ADPCM signal and output the decoded ADPCM signal;

a selecting section adapted to calculate a selection signal for selecting the adaptive quantization characteristic based on the first and second signals;

an adaptive inverse-quantizing section adapted to select an inverse function of the function for changing the adaptive quantization characteristic based on the selection signal, and use the selected inverse function to inverse-quantize the decoded ADPCM signal so as to convert the decoded ADPCM signal into a corresponding differential value; and an adder section adapted to add the differential value and a decoded signal of one sample ago to calculate a decoded signal value corresponding to the differential value, and output the calculated decoded signal value as the PCM signal.

* * * * *